(12) United States Patent
Ghosh et al.

(10) Patent No.: US 9,013,941 B2
(45) Date of Patent: Apr. 21, 2015

(54) DRAM WITH PULSE SENSE AMP

(71) Applicant: Intel Corporation, Santa Clara, CA (US)

(72) Inventors: Swaroop Ghosh, Hillsboro, OR (US); Mesut Meterelliyoz, Portland, OR (US); Faith Hamzaoglu, Portland, OR (US); Yih Wang, Portland, OR (US); Kevin X. Zhang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/839,174

(22) Filed: Mar. 15, 2013

(65) Prior Publication Data

US 2014/0269009 A1    Sep. 18, 2014

(51) Int. Cl.
| | | |
|---|---|---|
| G11C 7/00 | (2006.01) |
| G11C 11/4091 | (2006.01) |
| G11C 11/56 | (2006.01) |
| G11C 7/06 | (2006.01) |
| G11C 7/08 | (2006.01) |

(52) U.S. Cl.
CPC ........ *G11C 11/4091* (2013.01); *G11C 11/5642* (2013.01); *G11C 7/065* (2013.01); *G11C 7/08* (2013.01)

(58) Field of Classification Search
CPC ...... G11C 7/1072; G11C 7/1051; G11C 7/00; G11C 29/026; G11C 11/4091; G11C 11/4097; G11C 7/065; G11C 7/12; G11C 2207/065; G11C 11/4074; G11C 11/405; G11C 5/147; G11C 11/5642; G11C 16/26; G11C 7/06; G11C 13/004
USPC ................ 365/149, 205, 189.06, 189.09, 207
See application file for complete search history.

(56) References Cited

U.S. PATENT DOCUMENTS

| | | | | |
|---|---|---|---|---|
| 6,058,061 | A * | 5/2000 | Ooishi ......................... 365/222 |
| 6,115,284 | A * | 9/2000 | Matsumiya et al. .......... 365/149 |
| 6,925,022 | B2 * | 8/2005 | Arimoto et al. ............... 365/222 |
| 8,625,372 | B2 * | 1/2014 | Kumar et al. ................. 365/205 |
| 2003/0235102 | A1 * | 12/2003 | Joo ............................... 365/207 |
| 2004/0042305 | A1 * | 3/2004 | Joo ............................... 365/205 |
| 2012/0133399 | A1 * | 5/2012 | Watanabe et al. ............. 327/109 |
| 2012/0195146 | A1 * | 8/2012 | Jun et al. ....................... 365/203 |

* cited by examiner

*Primary Examiner* — David Lam
(74) *Attorney, Agent, or Firm* — Green, Howard & Mughal LLP

(57) ABSTRACT

Disclosed is a pulsed sense amplifier approach for resolving data on a bit line. A chip is provided which comprises a sense amplifier coupled to first and second DRAM bitlines; and a circuit having a trigger node coupled to the sense amp to transition it from a first state to a second state to trigger the sense amp, the circuit having an element to impede the transition once it is initiated. A chip is described which comprises: a DRAM array having a plurality of bitlines; sense amplifiers to resolve data on the bit lines, and a circuit to slow down resolution of the data by the sense amps after they have been triggered to resolve the data.

15 Claims, 3 Drawing Sheets

DRAM WITH PULSE SENSE AMP

TECHNICAL FIELD

The present invention relates generally to DRAM, and in particular, to reading DRAM cells using sense amplifiers.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
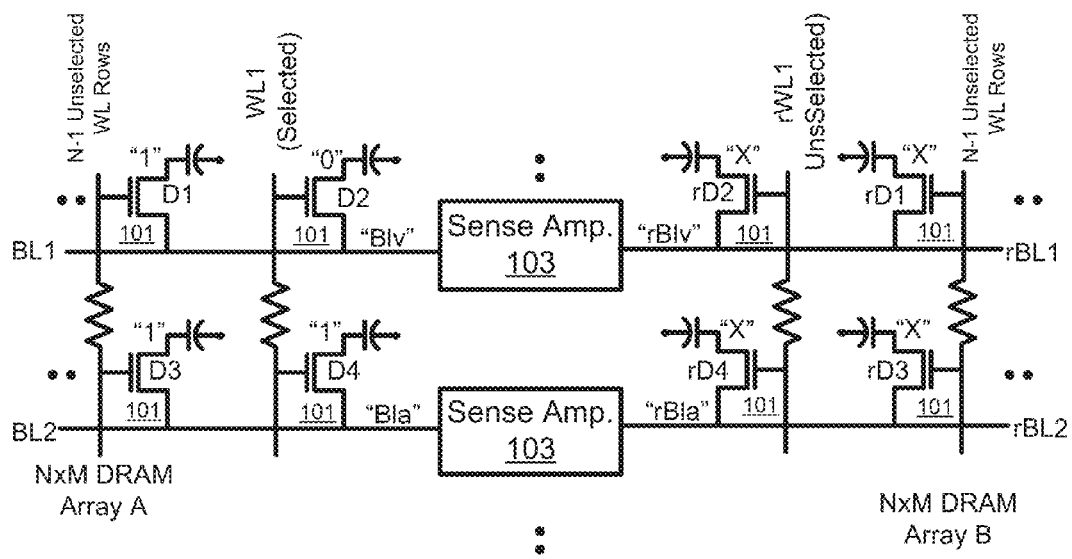
FIG. 1 is a diagram showing a portion of a DRAM sector illustrating pattern induced bit/word line coupling noise in an open bitline architecture.

FIG. 1 shows a portion of referenced DRAM (dynamic random access memory) arrays A and B. Each array (or sector) comprises M rows (corresponding to wordlines) by N columns (corresponding to bitlines) of DRAM cells 101. Each cell (101) has a capacitor for storing a high (e.g., logic "1") or a low (e.g., logic "0" charge level and a transistor to couple the capacitive charge to an associated bitline when the transistor is turned on by its associated wordline. Each array has a bitline that is associated with a bitline from the other array, forming pairs of associated bitlines. In turn, each bitline pair is coupled to an associated sense amplifier 103.

Figure 3:
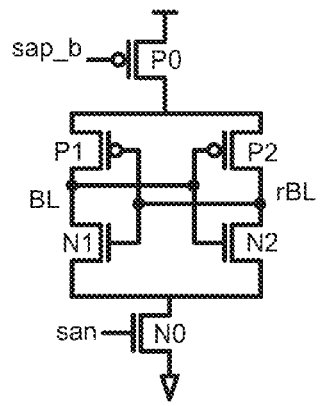
FIG. 3 is a schematic diagram of a sense amplifier in accordance with some embodiments.

With additional reference to FIG. 3, an exemplary sense amp circuit is shown. It comprises reverse coupled inverters formed from transistors N1, N2, P1, and P2, along with a footer transistor N0 and a header transistor P0. The indicated BL and rBl nodes are coupled to their associated bitline and reference bitline nodes indicated in FIG. 1 and function as both inputs and outputs. The footer and header transistors, when turned on, cause the reverse coupled inverters to resolve the values at the BL and rBL lines into solid logic values.

When a row of cells are to be read, the associated wordline is selected (asserted to turn on the cell transistors in the wordline) thereby coupling the stored cell charge states to their associated bitlines, and the sense amplifiers are then activated (or fired) to read the values from the selected wordline. So, all of the sense amplifiers fire at the same time to read the cells from the selected wordline, each sense amplifier reading the selected binary value from its associated bitline.

In the depicted embodiment, the arrays are in a reference pair configuration. This means that each bitline from the left side (array A) shares a common sense amplifier with an associated bitline from the right side (array B). For a given write or read operation, one side is active, while the other side functions as the reference side. (In the depicted figure, the left side is the active array, and the right side is the reference array, with its cells and wordlines indicated with an "r" in front of their labels. When an array is the reference array, prior to a read operation, its bitlines are precharged to a reference voltage level (e.g., 0.5 V). The data values in the active array, "0"s or "1"s, should have voltage charge levels that are lower or higher, respectively, than the reference level. For example, with the reference level being 0.5 V, a logic Low ("0") might be 0.4 V and a logic High ("1") might be 0.6 V. When a sense amp. is fired, it compares the bitline value from the active side against the reference level from the reference side and "resolves" the read active side value as a "1" if it is larger than the reference level or as a "0" if it is lower than the reference level. (Note that a benefit of this architecture is that both sides can store data. The wordlines (rWL) on the reference side, even the counterpart reference wordline to the selected wordline from the active side, remain unselected, for precharge and read operations. This means that the reference cells can store data, even while their bitlines are used for providing reference voltage levels. The reference bitlines themselves are precharged, but the reference wordlines stay unselected, decoupling their storage cells from the precharge and read operations.)

Unfortunately, read errors can occur, due to, among other things, induced coupling noise. Induced coupling noise is one of the intrinsic failure mechanisms in large DRAM arrays. It can occur when a "victim" cell is surrounded by cells (so-called aggressor cells) with the opposite logic value. So, it may occur when a store-1 cell is surrounded by store-0 cells, or, as with the indicated example of FIG. 1, when a store-0 cell is surrounded by store-1 cells.

During a read operation, the data from the aggressor cells corrupts the value that is supposed to be resolved on the victim bitline. For example, if there is an isolated store-0 bit in a sea of store-1 bits on one wordline, the coupling noise from the store-1 bitlines can propagate to the store-0 bitline once the sense amplifier is fired. (An example of this is represented in FIG. 1 with D2, storing a "0", and D1, D3 and D4 storing "1"s. In this example, bitline 1 is corrupted by bitline 2, so bitline 1 is designated as a victim bitline "BLv", while bitline 2 is designated as an aggressor bitline "BLa".)

The aggressor bitlines (up to a total of M−1 bitlines, most not shown, in this example) couple through selected WL and unselected wordlines during sense amp firing through, e.g., overlap capacitance from the neighboring cell transistors. This coupling noise in turn propagates to the victim bitline (BLv), with the aggressor "1"s fighting against the "0" value, which is supposed to be resolved on the victim bitline. At the same time, the aggressor reference bit lines (rBLa") resolve to a "0", which leaks, or couples, to the victim reference bitline, which is suppose to resolve to a "1". This BL-WL-BL coupling reduces the sense margin of the victim bit and results in a reduced read sense margin.

Figure 2:
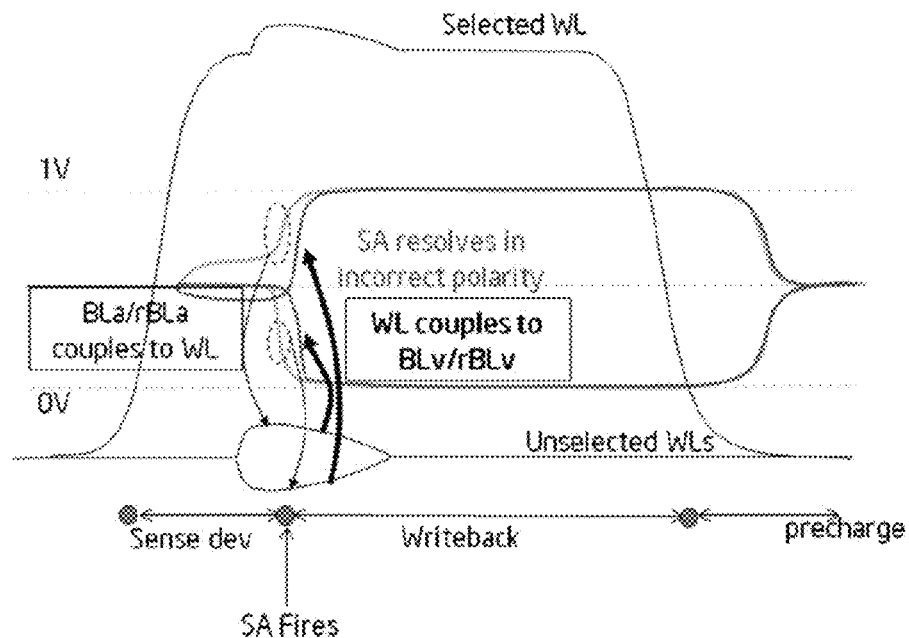
FIG. 2 is a signal diagram showing an errant read operation due to pattern induced signal noise for the DRAM sector of FIG. 1.

Such a coupling noise event is illustrated in FIG. 2. During a read or refresh operation, the aggressor bitlines (BLa) with store-1 bits swing to 1 (resolve to 1 by their sense amplifiers) and their reference bitlines (rBLa) swing to 0 once the sense amp fires. The aggressor bitlines couple through selected and unselected wordlines to the victim bitline through the overlap capacitances in that particular sector. This is shown by the positive noise bump on the unselected WL in FIG. 2. In addition, the reference aggressor bitlines (rBLa's) couple their resolved "0"s through selected and unselected reference wordlines, fighting against the reference victim bitline (rBL1), which is suppose to resolve to a "1". This is shown by the negative noise bump on the unselected WL in FIG. 2. The positive noise on unselected WLs, in turn, couple with the victim bitline that is trying to resolve to '0'. If the noise coupling is strong enough, the sense operation can fail (as indicated in FIG. 2), especially under strict retention time constraints.

Figure 5:
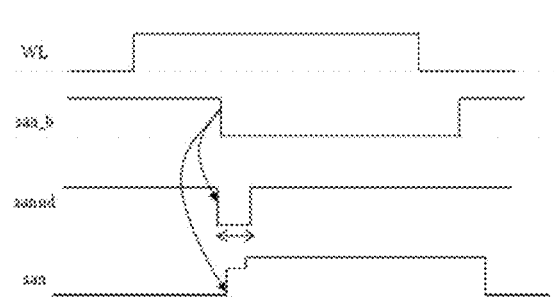
FIG. 5 is a signal diagram showing sense amplifier activation in accordance with some embodiments.
Figure 4:
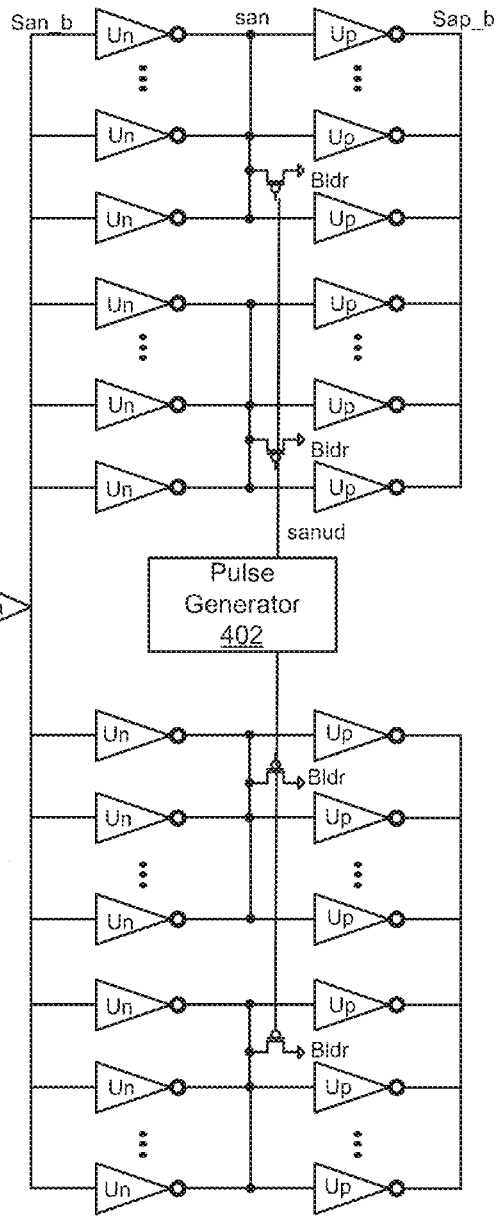
FIG. 4 is a diagram of a portion of a sense amp signal generator with impeded sense amplifier activation in accordance with some embodiments.

In some embodiments, to redress this problem, a pulsed sense amp structure, such as is illustrated in FIGS. 4 and 5, maybe employed. The general idea of a pulsed sense amp approach is to slow down the sense amps in order to slow down any aggressor sense amps. This does not necessarily mean that the sense amps are initiated at a later time, but rather, their resolving operation itself is slowed down. The slower swing (resolving) of BLa and rBLa reduces the amount of coupling noise that is propagated to the BLv and rBLv when the sense amp fires. Due to reduced coupling noise, the victim sense amp sees a better differential signal and will be more likely to resolve in the correct direction. Once the victim sense amp becomes strong, it can resists the coupling noise from the aggressors and correctly resolve the data value.

FIG. 4 shows an exemplary scheme for implementing a pulsed sense amp in accordance with some embodiments. The circuit includes inverters (Un, Up) for generating sap_b and san signals for the header and footer transistors, respectively, to control firing of the sense amps. (Each row of inverters drives a separate sense amp, with the san signal coupled to control the sense amp footer and the sap_b signal coupled to control the sense amp header.) The circuit also includes a pulse generator 402 to generate a pulse on an "sanud" line and bleeder transistors (bldr) controlled by the sanud line and coupled to the san nodes to draw charge away from them in order to dampen san rise times and sap_b fall times.

With additional reference to the signal diagram of FIG. 5, the sense amps are triggered by the san and sap_b signals. The sense amp starts resolving once the header and footer transistors are turned on. The idea behind the pulsed sense amp is to turn on the sense amps weakly by under driving the header/footers. The slower sense amp resolution helps in reducing the negative affects of coupling noise from aggressor bitlines. The under drive is achieved by the bleeders (PMOS in the depicted embodiment) that are inserted in the san node. Of course, any suitable bleeder element could be used, but an advantage of using a PMOS bleeder is that when used to selectably couple the san node to the low supply reference, it doesn't significantly affect the san signal slope until the PMOS threshold (Vt) point is reached. The san gets under driven once the bleeder turns on. This in turn under drives the sap_b signal as well.

The bleeder is controlled by the pulse generator. The pulse generator asynchronously activates the bleeders for short amounts of time when the sense amp is fired. This serves to ensure that the sense amp returns to full strength after the coupling event is over, and the data-out path is not compromised in terms of speed.

The timing diagram for the pulsed sense amp is shown in FIG. 5. Signal san_b triggers both pulse generator and san. The pulse generator generates a short pulse and momentarily under drives the san signal, causing both the san and sap_b signals (not shown in timing diagram) to be impeded in reaching their active states.

Figure 6:
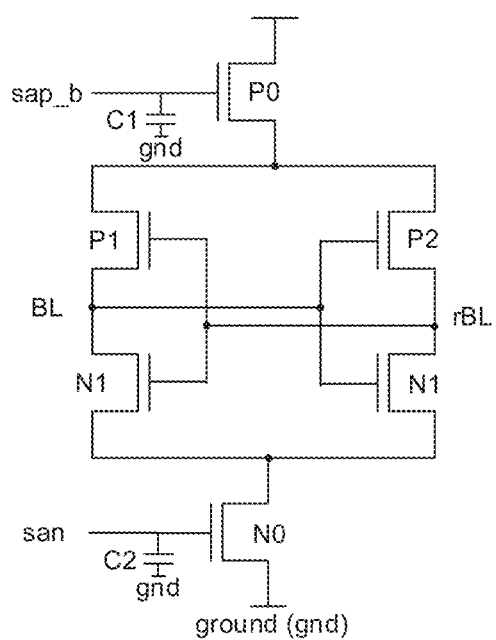
FIG. 6 is a schematic diagram of a sense amplifier in accordance with some embodiements.

It should be appreciated that any suitable circuit could be used to slow down the resolution of sense amplifiers to minimize the adverse effects of noise coupling as taught herein. For example, the sense amplifier itself could be designed to resolve sufficiently slowly for enhanced read stability. In some embodiments, sense amplifiers, for example, could include capacitive elements (e.g., capacitive elements C1 and C2 as shown in FIG. 6) at their trigger inputs to slow down trigger activation. However, an advantage of a bleeder implementation is that fewer circuit elements may be needed for implementation, i.e., a single bleeder serving multiple sense amplifier outputs may be employed. Moreover, while a stepped signal impairment is attained with the depicted pulsed circuitry, other schemes could be used attaining other signal types of signal shaping, e.g., ramps, exponential, etc. Along these lines, apart from using a transistor to divert charge away from a sense amplifier trigger node, other circuit elements or circuit element combinations could also be used to implement a bleeder.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
   a sense amplifier having at least three transistors, the sense amplifier coupled to first and second DRAM bit lines; and
   a circuit having a trigger node coupled to the sense amplifier to transition it from a first state to a second state to trigger the sense amplifier, the circuit having an element to impede the transition once it is initiated such as to slow down resolution of the sense amplifier.

2. The chip of claim 1, wherein the element comprises a transistor coupled to the trigger node to bleed charge away from the trigger node when it is transitioning to the second state.

3. The chip of claim 2, wherein the transistor is controlled by a pulse generator to generate a pulse that is smaller in time than a time allowed for the sense amplifier to resolve the first and second DRAM bit lines.

4. The chip of claim 3, wherein the transistor is a p-type transistor to selectably couple the trigger node to a low reference supply.

5. The chip of claim 3, wherein the transition from the first to the second state follows a stepped curve.

6. The chip of claim 1, wherein the element includes a capacitor to slow down the transition.

7. The chip of claim 1, wherein the circuit is part of the sense amplifier.

8. The chip of claim 1, wherein the circuit is part of a signal generation circuit for generating trigger signals for a plurality of different sense amplifiers.

9. The chip of claim 1, wherein the first and second DRAM bit lines are part of referenced DRAM arrays.

10. A chip, comprising:
    a DRAM array having a plurality of bit lines;
    sense amplifiers to resolve data on the bit lines, wherein at least one of the sense amplifiers having three transistors, and
    a circuit to slow down resolution of the data by the sense amplifiers after they have been triggered to resolve the data.

11. The chip of claim 10, wherein the circuit comprises one or more bleeder elements to slow down the resolution.

12. The chip of claim 11, wherein the one or more bleeder elements comprise transistors to bleed away charge from a signal node used to trigger the sense amplifiers.

13. The chip of claim 11, wherein the one or more bleeder elements comprise capacitors to take charge away from a trigger input of the sense amplifiers until they are charged.

14. The chip of claim 13, wherein the capacitors have an associated RC time constant that is less than the time allotted to the sense amplifiers for resolving data on the bit lines.

15. The chip of claim 10, wherein the sense amplifiers include at least one of a footer transistor and a header transistor with a trigger input to control when they resolve the data.

* * * * *